(12) United States Patent
Chou et al.

(10) Patent No.: US 11,196,270 B2
(45) Date of Patent: Dec. 7, 2021

(54) CHARGING METHOD FOR CHARGING BATTERY MODULE

(71) Applicant: Acer Incorporated, New Taipei (TW)

(72) Inventors: Shuo-Jung Chou, New Taipei (TW); Chuan-Jung Wang, New Taipei (TW)

(73) Assignee: Acer Incorporated, New Taipei (TW)

( * ) Notice: Subject to any disclaimer, the term of this patent is extended or adjusted under 35 U.S.C. 154(b) by 142 days.

(21) Appl. No.: 16/681,786

(22) Filed: Nov. 12, 2019

(65) Prior Publication Data

US 2021/0057922 A1 Feb. 25, 2021

(30) Foreign Application Priority Data

Aug. 20, 2019 (TW) .................................. 108129550

(51) Int. Cl.
*H01M 10/44* (2006.01)
*H02J 7/00* (2006.01)

(52) U.S. Cl.
CPC ............ *H02J 7/0021* (2013.01); *H02J 7/007* (2013.01)

(58) Field of Classification Search
CPC ...... H02J 7/005; H02J 7/0047; H02J 7/00712; H02J 7/007184; G01R 31/382
USPC .......................... 320/116, 132, 134, 136, 162
See application file for complete search history.

(56) References Cited

U.S. PATENT DOCUMENTS

| | | | |
|---|---|---|---|
| 5,644,212 A | 7/1997 | Takahashi | |
| 10,277,041 B2 | 4/2019 | Zane et al. | |
| 2010/0194339 A1* | 8/2010 | Yang | H02J 7/0016 320/116 |
| 2013/0257377 A1* | 10/2013 | Diamond | H02J 7/0047 320/116 |
| 2013/0257381 A1* | 10/2013 | Diamond | B60L 58/20 320/134 |

FOREIGN PATENT DOCUMENTS

| | | |
|---|---|---|
| CN | 106154175 | 11/2018 |
| CN | 106602636 | 7/2019 |
| TW | 200849766 | 12/2008 |
| TW | 201332252 | 8/2013 |
| TW | I543495 | 7/2016 |
| TW | 201712990 | 4/2017 |

OTHER PUBLICATIONS

"Search Report of Europe Counterpart Application", dated Jun. 2, 2020, p. 1-p. 7.

* cited by examiner

*Primary Examiner* — Edward Tso
(74) *Attorney, Agent, or Firm* — JCIPRNET (57) ABSTRACT

A charging method is provided for charging a plurality of batteries of a battery module. The charging method includes: obtaining a maximum voltage value and a minimum voltage value of a plurality of battery voltage values of the batteries according to a relative state of charge of the battery module during a charging process; obtaining a difference value between the maximum voltage value and the minimum voltage value; and adjusting a charging voltage value for charging the batteries and a taper voltage value for determining whether the batteries reach a charging saturation state according to the difference value.

6 Claims, 6 Drawing Sheets

CHARGING METHOD FOR CHARGING BATTERY MODULE

CROSS-REFERENCE TO RELATED APPLICATION

This application claims the priority benefit of Taiwan application serial no. 108129550, filed on Aug. 20, 2019. The entirety of the above-mentioned patent application is hereby incorporated by reference herein and made a part of this specification.

BACKGROUND

Technical Field

The disclosure relates to a charging method, and particularly relates to a charging method for charging a battery module.

Description of Related Art

In general, a battery module ages after use for a long time. In addition to battery inflation and durability reduction, a battery with the maximum voltage value may preferentially trigger an overvoltage protection mechanism of the battery module due to an imbalance of voltage values among a plurality of batteries of the battery module, thus making other batteries unable to reach the voltage saturation state.

Figure 1:
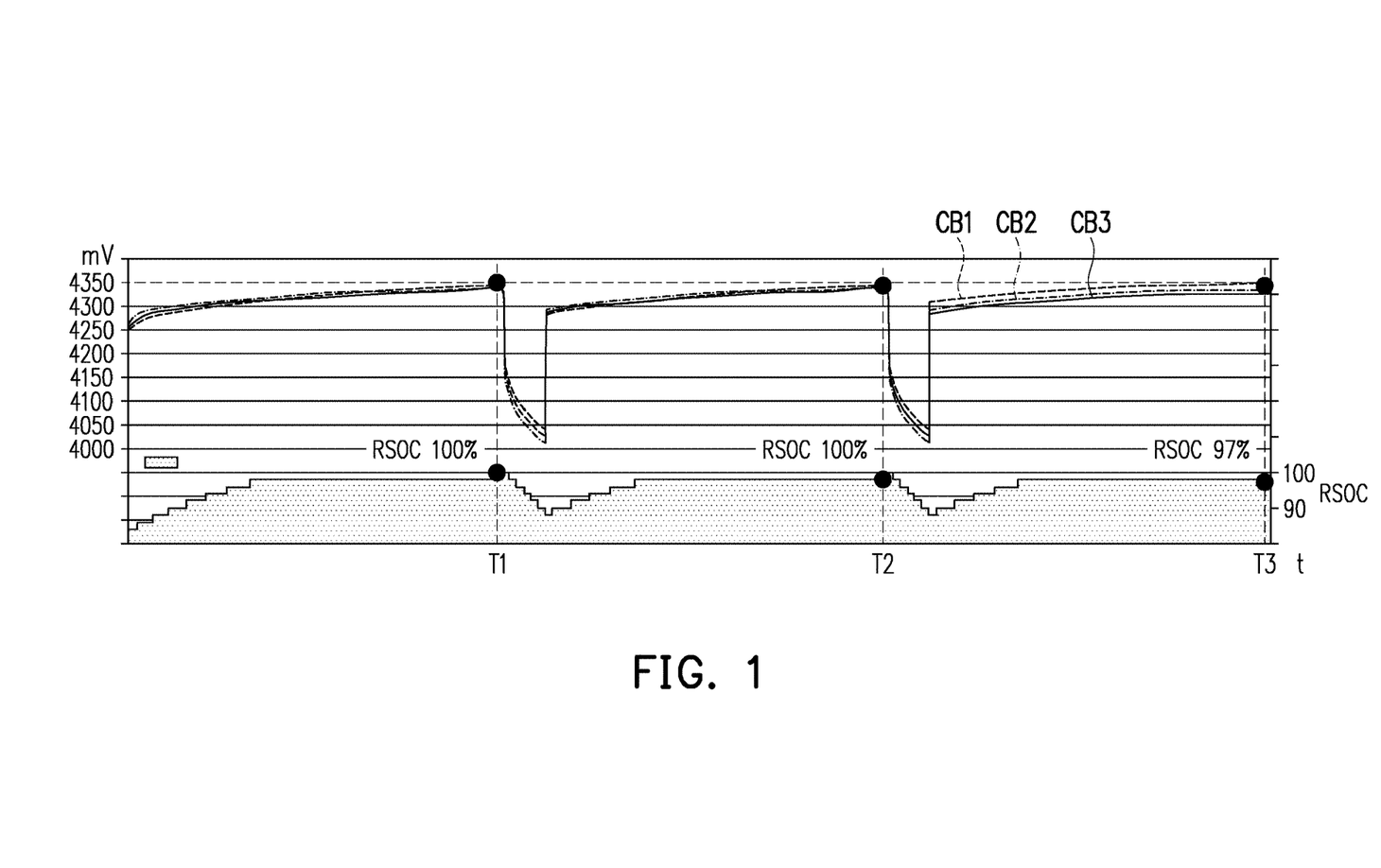
FIG. 1 is a schematic diagram of voltage curves for battery voltages of a plurality of batteries in a battery module charged according to a conventional charging method.

For example, referring to FIG. 1 which is a schematic diagram of voltage curves for battery voltages of a plurality of batteries in a battery module charged according to a conventional charging method, FIG. 1 shows battery voltage curves CB1, CB2 and CB3 of three batteries. In multiple charging processes, the battery voltage values of the three batteries are approximately consistent at time points T1 and T2, indicating that the battery voltage values of the three batteries are balanced. When the battery voltage curves CB1, CB2 and CB3 approach the overvoltage protection voltage (e.g., 4350 mV), the battery voltage values of the three batteries all reach the taper voltage (e.g., 4345 mV). Therefore, the relative state of charge (RSOC) of the battery module reaches 100%.

However, after use for a long time, the battery voltage curves CB1, CB2 and CB3 become inconsistent. The battery voltage value represented by the battery voltage curve CB1 is higher than the battery voltage values represented by the battery voltage curves CB2 and CB3. At the time point T3, the battery voltage curve CB1 reaches the overvoltage protection voltage (e.g., 4350 mV), triggers the overvoltage protection mechanism of the battery module, and stops the charging. At this time, the battery voltage values (e.g., 4335 and 4330 mV) of the batteries corresponding to the battery voltage curves CB2 and CB3 have not reached the taper voltage (e.g., 4345 mV). As a result, the RSOC of the battery module only reaches 97%, and cannot reach 100%. Therefore, how to alleviate the aging of the battery module and prolong the service life of the battery module through balancing the battery voltage values of the batteries is now an issue to work on in the charging technologies.

SUMMARY

The disclosure provides a charging method for balancing a plurality of battery values of a plurality of batteries to alleviate the aging of a battery module and prolong the service life of the battery module.

A charging method according to an embodiment of the disclosure is suitable for charging a plurality of batteries of a battery module. The batteries are connected in series with each other. The charging method includes: obtaining a maximum voltage value and a minimum voltage value of a plurality of battery voltage values of the batteries according to a relative state of charge (RSOC) of the battery module during a charging process; obtaining a difference value between the maximum voltage value and the minimum voltage value; and adjusting a charging voltage value for charging the batteries and a taper voltage value for determining whether the batteries reach a charging saturation state according to the difference value.

In one embodiment of the disclosure, obtaining the maximum voltage value and the minimum voltage value of the battery voltage values of the batteries according to the RSOC of the battery module includes: determining whether the RSOC of the battery module is greater than a preset state of charge; and obtaining the maximum voltage value and the minimum voltage value when the RSOC of the battery module is greater than the preset state of charge.

In one embodiment of the disclosure, the preset state of charge corresponds to an RSOC when the battery module is charged in a constant voltage charging mode.

In one embodiment of the disclosure, adjusting the charging voltage value for charging the batteries and the taper voltage value for determining whether the batteries reach the charging saturation state according to the difference value includes: determining whether the difference value is greater than a preset difference value; and adjusting the charging voltage value and the taper voltage value according to the difference value if the difference value is determined as being greater than the preset difference value.

In one embodiment of the disclosure, adjusting the charging voltage value for charging the batteries and the taper voltage value for determining whether the batteries reach the charging saturation state according to the difference value further includes: not adjusting the charging voltage value and the taper voltage value if the difference value is determined as being smaller than or equal to the preset difference value.

In one embodiment of the disclosure, adjusting the charging voltage value for charging the batteries and the taper voltage value for determining whether the batteries reach the charging saturation state according to the difference value includes: subtracting the difference value from the charging voltage to obtain an adjusted charging voltage value; and subtracting the difference value from the taper voltage to obtain an adjusted taper voltage value.

In one embodiment of the disclosure, the charging method includes determining whether the batteries reach the charging saturation state according to the adjusted taper voltage value.

Based on the above, according to the charging method, the maximum voltage value and the minimum voltage value in the battery voltage values of the batteries are obtained to derive the difference value between the maximum voltage value and the minimum voltage value, and the charging voltage value and the taper voltage value are adjusted according to the difference value. Accordingly, the aging of a battery module is alleviated and the service life of the battery module is prolonged.

In order to make the aforementioned and other objectives and advantages of the disclosure comprehensible, embodiments accompanied with figures are described in detail below.

DESCRIPTION OF THE EMBODIMENTS

Figure 2:
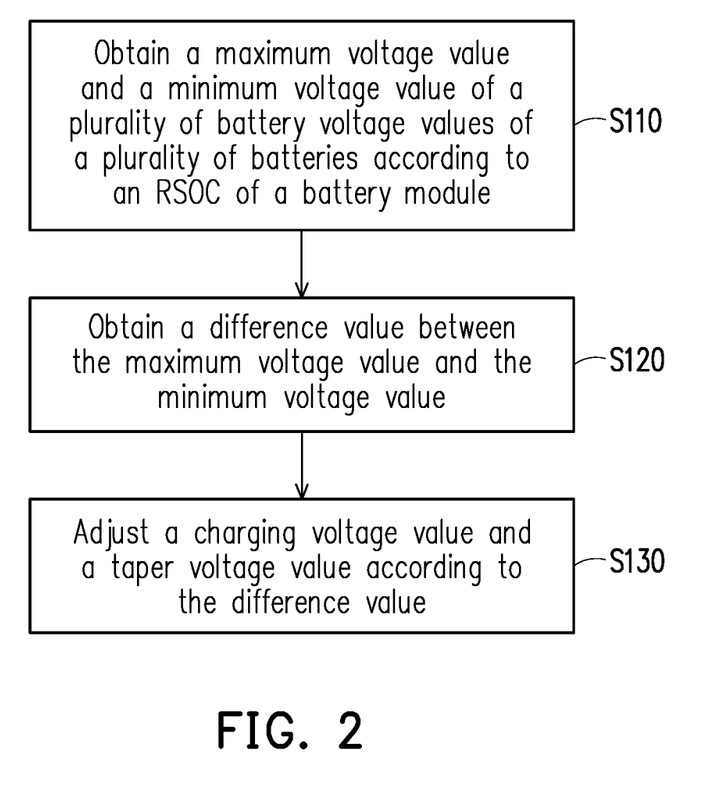
FIG. 2 is an operation flow chart of a charging method according to one embodiment of the disclosure.

Referring to FIG. 2 which is an operation flow chart of a charging method according to one embodiment of the disclosure, in the present embodiment, the charging method is suitable for charging a plurality of batteries of a battery module. The batteries are connected with each other in series. In step S110, according to the charging method, a maximum voltage value and a minimum voltage value in a plurality of battery voltage values of the batteries are obtained according to a relative state of charge (RSOC) of the battery module in the charging process. In step S110, according to the charging method, the battery voltage values of the batteries are obtained according to the RSOC of the battery module. Then, according to the charging method, the greatest battery voltage value and the smallest battery voltage value are selected from the battery voltage values. According to the charging method, the greatest battery voltage value is used as the maximum voltage value, and the smallest battery voltage value is used as the minimum voltage value.

In step S120, according to the charging method, a difference value between the maximum voltage value and the minimum voltage value is obtained. In the present embodiment, according to the charging method, the minimum voltage value is subtracted from the maximum voltage value to obtain the difference value between the maximum voltage value and the minimum voltage value.

In step S130, according to the charging method, a charging voltage value and a taper voltage value are adjusted according to the difference value. In the present embodiment, the charging voltage value is a voltage value used for charging the batteries. The taper voltage value is a set voltage value for determining whether the batteries reach a charging saturation state.

In the charging process, the maximum voltage value and the minimum voltage value in the battery voltage values of the batteries are obtained through the charging method to derive the difference value between the maximum voltage value and the minimum voltage value and the charging voltage value and the taper voltage value are adjusted according to the difference value. Therefore, by using the charging method, the battery voltage values of the batteries are balanced, the aging of a battery module is alleviated, and the service life of the battery module is prolonged.

Figure 3:
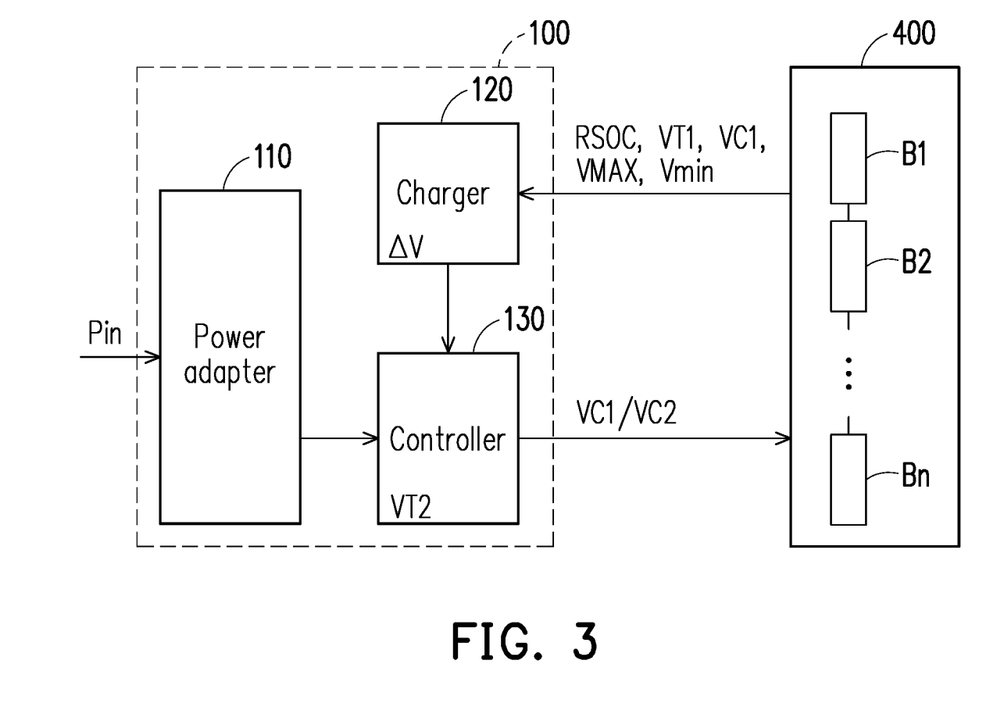
FIG. 3 is a schematic diagram of a charging device according to one embodiment of the disclosure.

Referring to FIG. 2 and FIG. 3 for specific illustration, FIG. 3 is a schematic diagram of a charging device according to one embodiment of the disclosure. The charging method of the present embodiment is at least applicable to the charging device 100 shown in FIG. 3. In the present embodiment, the charging device 100 includes a power adapter 110, a controller 120 and a charger 130. The power adapter 110 is configured for receiving an input power supply Pin, and providing a charging power supply PC according to the input power supply Pin. The controller 120 is coupled to a battery module 400. The controller 120 is configured for receiving the RSOC, a taper voltage value VT1, a charging voltage value VC1, a maximum voltage value VMAX and a minimum voltage value Vmin from the battery module 400. The charger 130 is coupled to the power adapter 110, the controller 120 and the battery module 400. The charger 130 is configured for receiving the provided charging power supply PC, and responds to the control of the controller 120 to charge batteries B1 to Bn of the battery module 400. In some embodiments, the controller 120 may be arranged inside the battery module 400. In some embodiments, the controller 120 may be arranged inside the charger 130.

In step S110, the controller 120 is configured for receiving the RSOC, the taper voltage value VT1, the charging voltage value VC1, the maximum voltage value VMAX and the minimum voltage value Vmin from the battery module 400. The controller 120 obtains the maximum voltage value VMAX and the minimum voltage value Vmin according to the RSOC of the battery module 400.

In step S120, the controller 120 obtains a difference value ΔV between the maximum voltage value VMAX and the minimum voltage value Vmin.

In step S130, the controller 120 adjusts the taper voltage value VT1 to an adjusted taper voltage value VT2 according to the difference value ΔV, and determines whether the batteries B1 to Bn reach the charging saturation state according to the adjusted taper voltage value VT2. The charger 130 receives the difference value ΔV and the charging power supply PC. The charger 130 adjusts the charging voltage value VC1 of the charging power supply PC to an adjusted charging voltage value VC2 according to the difference value ΔV. Thus, the charger 130 charges the batteries B1 to Bn according to the adjusted charging voltage value VC2.

Figure 4:
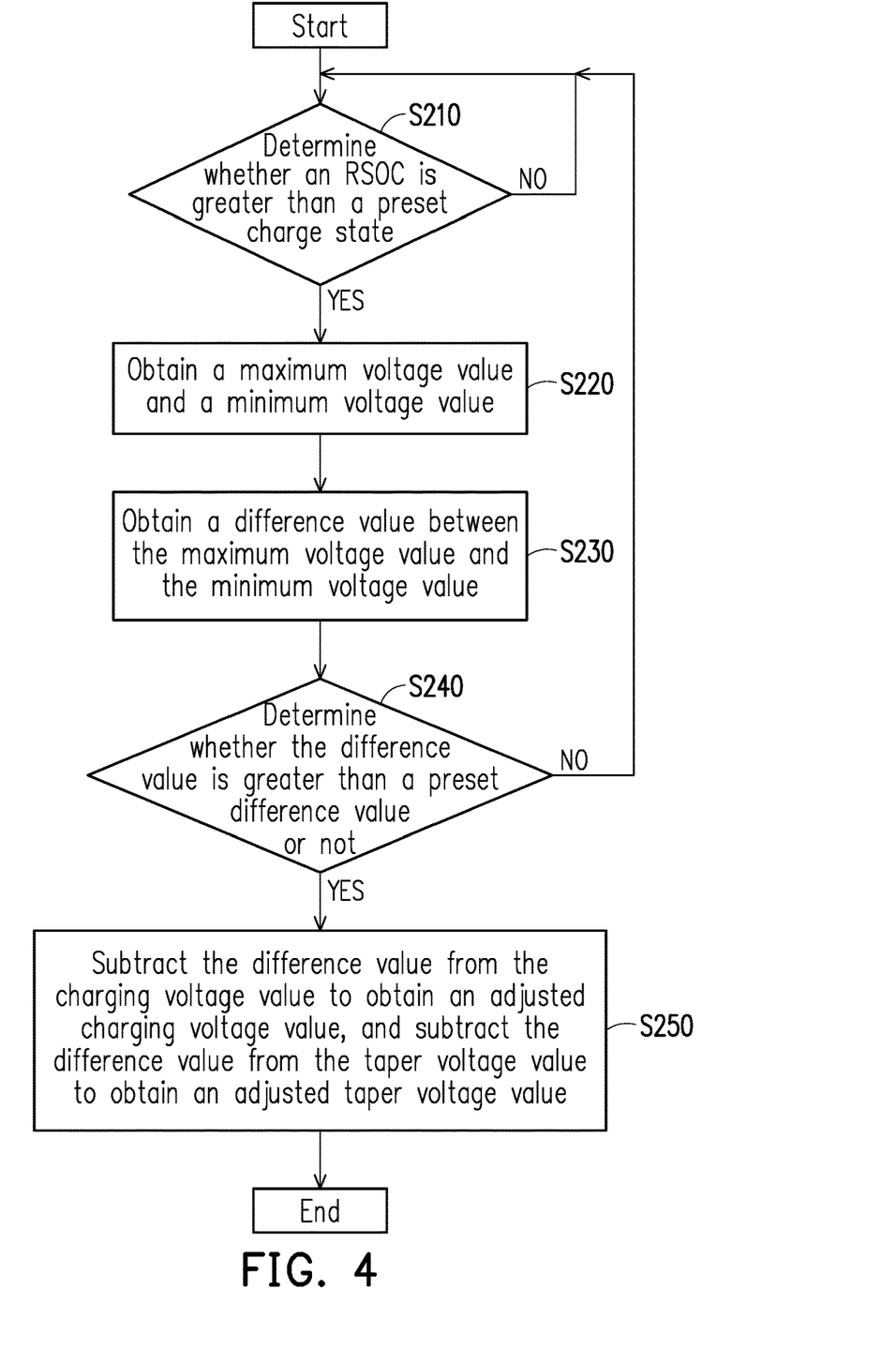
FIG. 4 is an operation flow chart of a charging method according to another embodiment of the disclosure.

Referring to FIG. 3 and FIG. 4 simultaneously, FIG. 4 is an operation flow chart of a charging method according to another embodiment of the disclosure. In the present embodiment, the charging method shown in FIG. 4 is applicable to the charging device 100. After the charging method is started, whether the RSOC state of the battery module 400 is greater than a preset state of charge is determined in step S210. In the present embodiment, according to the charging method, whether the RSOC of the battery module 400 is greater than the preset state of charge is determined by the controller 120. When the RSOC of the battery module 400 is smaller than or equal to the preset state of charge, the operation flow process enters step S220.

Figure 5:
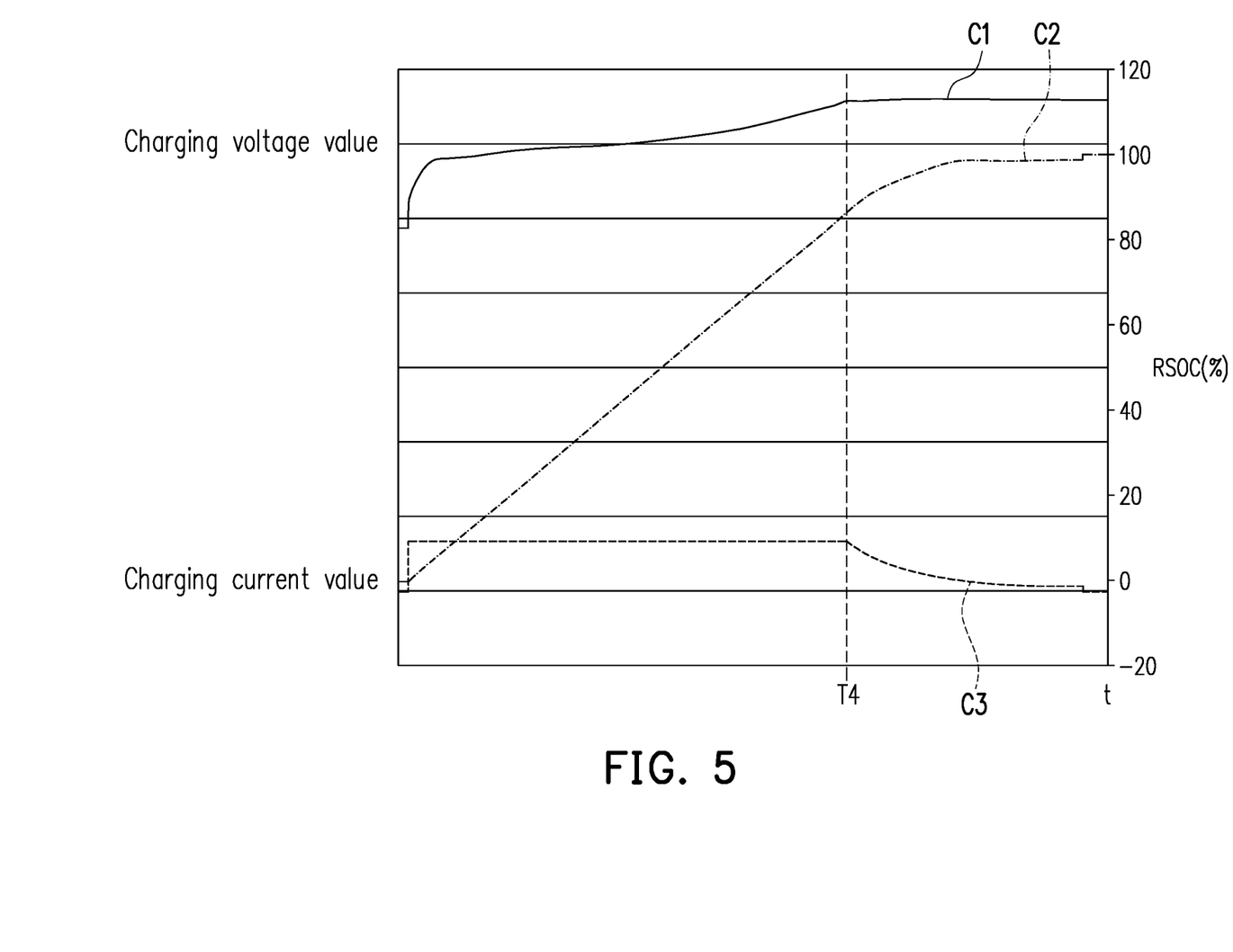
FIG. 5 is a schematic diagram of a charging voltage curve, an RSOC curve and a charging current curve according to one embodiment of the disclosure.

Referring to FIG. 5 for further illustration, FIG. 5 is a schematic diagram of a charging voltage curve, an RSOC curve and a charging current curve according to one embodiment of the disclosure. A charging voltage curve C1, an RSOC curve C2 and a charging current curve C3 are shown in the schematic diagram of the present embodiment. In the present embodiment, before a time point T4 in the charging process, according to the charging method, a constant current (CC) charging mode is configured for charging the battery module. In the CC charging mode, the charging current curve C3 indicates that a charging current value is constant. The charging voltage curve C1 indicates that a charging voltage value is variable. The increase in the battery voltage values of the batteries of the battery module is large. After the time point T4, according to the charging method, a constant voltage (CV) charging mode is configured for charging the battery module. In the CV charging mode, the charging voltage curve C1 indicates that the charging voltage value is constant. The charging current curve C3 indicates that the charging current value is gradually reduced. The change of the battery voltage values of the batteries of the battery module is small. Accordingly, the relatively accurate maximum voltage value and the relatively accurate minimum voltage value are obtained in the CV charging mode. Therefore, a default state of charge corresponds to a RSOC when the battery module 400 is charged in the CV charging mode. The RSOC after the time point T4 of the RSOC curve C2 can be used as the preset state of charge. By taking FIG. 5 as an example, the preset state of charge may be, for example, any value between 85% and 95%.

Returning to the embodiments of FIG. 3 and FIG. 4. On the other hand, when the RSOC of the battery module 400 is greater than the preset state of charge, the operation flow process returns to step S210. The charger 130 charges the batteries B1 to Bn according to the charging voltage value VC1.

In step S220, the controller 120 obtains the maximum voltage value VMAX and the minimum voltage value Vmin. In step S230, the controller 120 obtains the difference value $\Delta V$ between the maximum voltage value VMAX and the minimum voltage value Vmin. In the present embodiment, the controller 120 subtracts the minimum voltage value Vmin from the maximum voltage value VMAX to obtain the difference value $\Delta V$.

Figure 6:
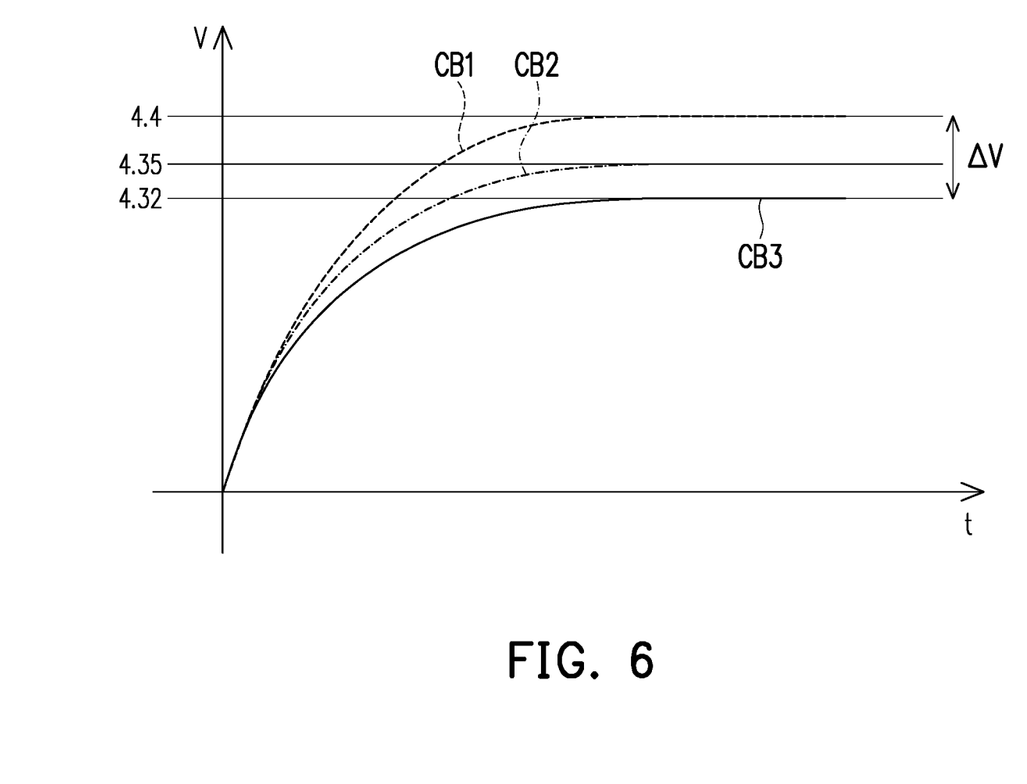
FIG. 6 is a schematic diagram of battery voltage curves according to one embodiment of the disclosure.

Referring to FIG. 6 for further illustration of embodiments for obtaining a difference value, FIG. 6 is a schematic diagram of battery voltage curves according to one embodiment of the disclosure. In the present embodiment, the schematic diagram in FIG. 6 shows battery voltage curves CB1 to CB3. In a CV charging mode, the battery voltage curve CB1 in the battery voltage curves CB1 to CB3 has the largest battery voltage value (e.g., 4.4 V). The battery voltage curve CB3 has the smallest battery voltage (e.g., 4.32 V). The largest battery voltage is used as the maximum voltage value. The smallest battery voltage is used as the minimum voltage value. Therefore, the difference value equals to 0.08V.

Returning to the embodiments in FIG. 3 and FIG. 4. After the difference value $\Delta V$ is obtained, the operation flow process enters step S240. In step S240, the controller 120 determines whether the difference value $\Delta V$ is greater than a preset difference value. When the controller 120 determines that the difference value $\Delta V$ is greater than the preset difference value, the operation flow process returns to step S250. In step S250, according to the charging method, the charging voltage value VC1 and the taper voltage value VT1 are adjusted according to the difference value $\Delta V$. In the present embodiment, according to the charging method, the controller 120 subtracts the difference value $\Delta V$ from the taper voltage value VT1 to obtain an adjusted taper voltage value VT2. According to the charging method, the controller 130 subtracts the difference value $\Delta V$ from the charging voltage value VC1 to obtain the adjusted charging voltage value VC2. That is, once the RSOC of the battery module 400 is greater than the preset state of charge, and the difference value $\Delta V$ is greater than the default difference value, the charging voltage value CV1 and the taper voltage value VT1 are adjusted. Therefore, the charging device 100 charges the battery module 400 according to the adjusted charging voltage value VC2. The charging device 100 determines whether the batteries B1 to Bn reach the charging saturation state according to the adjusted taper voltage value VT2.

On the other hand, when the controller 120 determines that the difference value $\Delta V$ is smaller than or equal to the preset difference value, the charging voltage value VC1 and the taper voltage value VT1 are not adjusted. The operation flow process returns to step S210. The charger 130 charges the batteries B1 to Bn according to the charging voltage value VC1.

For example, the preset difference value is set to be 0.05V. After the difference value $\Delta V$ equal to 0.08V is obtained in step S230, the controller 120 determines that the difference value $\Delta V$ is greater than the preset difference value in step S240. Therefore, in step S250, the controller 120 subtracts the difference value $\Delta V$ (i.e., 0.08 V) from the taper voltage value VT1 to obtain the adjusted taper voltage value VT2. In addition, the charger 130 subtracts the difference value $\Delta V$ from the charging voltage value VC1 to obtain the adjusted charging voltage value VC2, and charges the battery module 400 according to the adjusted charging voltage value VC2. The preset difference value in the present embodiment may be set according to design requirements. The disclosure is not limited thereto.

Based on the above, according to the charging method of the disclosure, the maximum voltage value and the minimum voltage value in the battery voltage values of the batteries are obtained to derive difference value between the maximum voltage value and the minimum voltage value, and the charging voltage value and the taper voltage value are adjusted according to the difference value. Accordingly, with the charging method of the disclosure, the battery voltage values of the batteries are balanced, the aging of the battery module is alleviated, and the service life of the battery module is prolonged.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A charging method for charging a plurality of batteries of a battery module, wherein the batteries are connected in series with each other, and the charging method comprises:
   obtaining a maximum voltage value and a minimum voltage value in a plurality of battery voltage values of the batteries according to a relative state of charge (RSOC) of the battery module during a charging process;
   obtaining a difference value between the maximum voltage value and the minimum voltage value; and
   adjusting a charging voltage value for charging the batteries and a taper voltage value for determining whether the batteries reach a charging saturation state according to the difference value,
   wherein obtaining the maximum voltage value and the minimum voltage value in the battery voltage values of the batteries according to the RSOC of the battery module comprises:
     determining whether the RSOC of the battery module is greater than a preset state of charge; and
     obtaining the maximum voltage value and the minimum voltage value when the RSOC of the battery module is greater than the preset state of charge.

2. The charging method according to claim 1, wherein the preset state of charge corresponds an RSOC when the battery module is charged in a constant voltage charging mode.

3. The charging method according to claim 1, wherein adjusting the charging voltage value for charging the batteries and the taper voltage value for determining whether the batteries reach the charging saturation state according to the difference value comprises:

determining whether the difference value is greater than a preset difference value; and adjusting the charging voltage value and the taper voltage value according to the difference value when the difference value is determined as being greater than the preset difference value.

4. The charging method according to claim 3, wherein adjusting the charging voltage value for charging the batteries and the taper voltage value for determining whether the batteries reach the charging saturation state according to the difference value further comprises:

not adjusting the charging voltage and the taper voltage value when the difference value is determined as being smaller than or equal to the preset difference value.

5. The charging method according to claim 1, wherein adjusting the charging voltage value for charging the batteries and the taper voltage value for determining whether the batteries reach the charging saturation state according to the difference value comprises:

subtracting the difference value from the charging voltage value to obtain an adjusted charging voltage value; and subtracting the difference value from the taper voltage value to obtain an adjusted taper voltage value.

6. The charging method according to claim 5, further comprising:

determining whether the batteries reach the charging saturation state according to the adjusted taper voltage value.

* * * * *